United States Patent
Boivin et al.

(10) Patent No.: US 10,431,630 B2
(45) Date of Patent: Oct. 1, 2019

(54) METHOD FOR PRODUCING TRANSISTORS, IN PARTICULAR SELECTION TRANSISTORS FOR NON-VOLATILE MEMORY, AND CORRESPONDING DEVICE

(71) Applicant: STMicroelectronics (Rousset) SAS, Rousset (FR)

(72) Inventors: Philippe Boivin, Venelles (FR); Jean-Jacques Fagot, Rousset (FR)

(73) Assignee: STMicroelectronics (Rousset) SAS, Rousset (FR)

(*) Notice: Subject to any disclaimer, the term of this patent is extended or adjusted under 35 U.S.C. 154(b) by 84 days.

(21) Appl. No.: 15/436,963

(22) Filed: Feb. 20, 2017

(65) Prior Publication Data

US 2018/0076265 A1 Mar. 15, 2018

(30) Foreign Application Priority Data

Sep. 9, 2016 (FR) ...................................... 16 58405

(51) Int. Cl.
*H01L 27/24* (2006.01)
*H01L 21/762* (2006.01)
*H01L 29/423* (2006.01)
*H01L 29/66* (2006.01)
*H01L 29/78* (2006.01)
(Continued)

(52) U.S. Cl.
CPC ...... *H01L 27/2454* (2013.01); *H01L 21/2815* (2013.01); *H01L 21/76224* (2013.01); *H01L 27/2463* (2013.01); *H01L 29/4236* (2013.01); *H01L 29/66484* (2013.01); *H01L 29/66666* (2013.01); *H01L 29/7827* (2013.01);
(Continued)

(58) Field of Classification Search
CPC ...................... H01L 27/2454; H01L 29/66666
See application file for complete search history.

(56) References Cited

U.S. PATENT DOCUMENTS 9,559,297 B2  1/2017  Boivin et al.
2008/0124867 A1*  5/2008  Brown .................... H01L 21/84
438/268

(Continued)

FOREIGN PATENT DOCUMENTS

FR  3023647 A1  1/2016
WO  WO-2005079182 A2  9/2005

OTHER PUBLICATIONS

INPI Search Report and Written Opinion for FR 1658405 dated Apr. 4, 2017 (9 pages).

*Primary Examiner* — Timor Karimy
(74) *Attorney, Agent, or Firm* — Crowe & Dunlevy (57) ABSTRACT

A MOS transistor with two vertical gates is formed within a substrate zone of a semiconductor substrate doped with a first type of conductivity and separated from a remaining portion of the substrate by two first parallel trenches extending in a first direction. An isolated gate region rests on each flank of the substrate zone and on a portion of the bottom of the corresponding trench to form the two vertical gates. At least one gate connection region electrically connects the two vertical gates. A first buried region located under the substrate zone is doped with a second type of conductivity to form a first conduction electrode of the MOS transistor. A second region doped with the second type of conductivity is located at the surface of the substrate zone to form a second conduction electrode of the MOS transistor.

16 Claims, 5 Drawing Sheets

(51) Int. Cl.
*H01L 45/00* (2006.01)
*H01L 21/28* (2006.01)

(52) U.S. Cl.
CPC .......... *H01L 45/1233* (2013.01); *H01L 45/16* (2013.01); *H01L 45/06* (2013.01)

(56) References Cited

U.S. PATENT DOCUMENTS

| | | |
|---|---|---|
| 2010/0252879 A1 | 10/2010 | Ogawa et al. |
| 2011/0188288 A1 | 8/2011 | Minami |
| 2012/0080725 A1* | 4/2012 | Manos .................. H01L 27/101 257/208 |
| 2012/0112270 A1* | 5/2012 | Park .................... H01L 21/2257 257/330 |
| 2014/0169105 A1* | 6/2014 | Oh ....................... H01L 29/7926 365/185.29 |
| 2016/0013245 A1 | 1/2016 | Boivin et al. |

* cited by examiner

METHOD FOR PRODUCING TRANSISTORS, IN PARTICULAR SELECTION TRANSISTORS FOR NON-VOLATILE MEMORY, AND CORRESPONDING DEVICE

PRIORITY CLAIM

This application claims the priority benefit of French Application for Patent No. 1658405, filed on Sep. 9, 2016, the disclosure of which is hereby incorporated by reference in its entirety.

TECHNICAL FIELD

Embodiments and modes of implementation relate to memory, and, more particularly, to methods for producing selection transistors for a resistive memory, and to corresponding devices.

BACKGROUND

Resistive memory, for example phase-change memory PCM or oxide-based random access memory OxRAM, usually comprises memory points each having a selection transistor and a memory cell that is capable of storing a logic datum, and which are distributed in a matrix along rows and columns in a memory plane. A memory cell is accessed through the selection transistor and via word lines along the rows of the memory plane and bit lines along the columns of the memory plane.

Resistive memory technologies are promising in numerous aspects, in particular in terms of density since the memory cell, incorporated within the back-end-of-line BEOL interconnect layers, may be superposed over the selection transistor formed in and on a semiconductor substrate, in contrast to "conventional" non-volatile memory, for example EEPROM or NAND flash, in which the memory cell is generally also formed in and on the semiconductor substrate.

Consequently, a limitation in terms of the compactness of the resistive memory memory points is the area occupied by a selection transistor.

In this regard it has been proposed, in United States Patent Application Publication No. 2016/0013245 (French Publication No. 3023647A1), incorporated by reference, to form vertical-gate selection transistors, which are more compact than planar transistors. However, in this configuration a vertical gate may introduce the formation of a parasitic conduction channel in an adjacent transistor, causing errors when accessing a memory cell. Doping a region facing a face of the gate makes it possible to limit the formation of such a parasitic conduction channel.

However, resistive memory cells may require a particularly large current for writing a datum.

SUMMARY

According to modes of implementation and embodiments, a solution of isolating two adjacent vertical selection transistors is proposed, allowing, in particular, more current to be dumped into a selection transistor and the area occupied by a selection transistor to be minimized.

According to a first aspect, a method is proposed for producing a MOS transistor with two vertical gates comprising: producing, in a semiconductor substrate having a first type of conductivity, a first buried region having a second type of conductivity so as to form a first conduction electrode of the transistor; etching, in the semiconductor substrate up to the first buried region, two first parallel trenches that extend in a first direction and delimit a substrate zone; forming, on each flank of the substrate zone and on a portion of the bottom of the corresponding trench, an isolated region comprising a gate material so as to form the two vertical gates; making an electrically conductive connection between the two gate regions; forming, on the surface of the substrate zone, a second region having the second type of conductivity so as to form a second electrode of the transistor.

Thus, the formation of the two vertical gates on each flank of the substrate zone allows substantially twice as much current as for a typical transistor having only one useful vertical gate to be dumped into the MOS transistor produced according to this aspect.

Additionally, the fact that said vertical gates rest on a portion of the bottom of the trench means that another portion of the bottom of the trench is not covered by a gate material, thereby leaving the advantageous possibility of electrically isolating each gate from a potential other neighboring gate region.

According to one mode of implementation, the two first trenches are wider than they are deep and the formation of the gate regions comprises an operation of depositing a gate oxide and a gate material on the substrate zone and in said trenches and an operation of anisotropically etching the gate material and the gate oxide until the surface of said substrate zone and another portion of the bottom of the corresponding trench is uncovered.

According to one mode of implementation, the production of the electrically conductive connection between the two gate regions comprises the formation of two second parallel trenches that are deeper than they are wide, extending in a second direction that is perpendicular to the first direction, and which are filled with the gate material and located on either side of the transistor.

These modes of implementation allow, on the one hand, the gates of a transistor to be isolated from possible neighboring structures and, on the other hand, more current to be carried than for a conventional transistor comprising only one gate.

Additionally, the formation of the substrate zones and gate regions via trenches is easily adapted to simultaneous production of transistors arranged along two directions of a plane.

Thus, such transistors are particularly advantageous in the capacity of selection transistors of a non-volatile memory, for example a resistive non-volatile memory.

For this reason a method is also proposed for producing an integrated circuit comprising a non-volatile memory having memory points each comprising a memory cell superposed over a selection transistor, in which the selection transistors are produced via the method defined above.

According to one mode of implementation, said electrically conductive connection is produced on either side of a group of selection transistors sharing their vertical gates, and which are arranged side-by-side in the first direction.

The method may additionally comprise the formation of metallic tracks extending in the first direction, which are electrically connected by vertical vias to said electrically conductive connections.

According to one mode of implementation, the production of the selection transistors comprises the formation of shallow trench isolations individually isolating, along the first direction, the portions of the second region that individually belong to each selection transistor.

Advantageously, the memory cells are resistive memory cells.

According to another aspect, an integrated circuit is proposed, comprising at least one MOS transistor with two vertical gates comprising a zone of a semiconductor substrate having a first type of conductivity separated from the rest of the substrate by two first parallel trenches extending in a first direction, an isolated gate region resting on each flank of the substrate zone and on a portion of the bottom of the corresponding trench and forming the two vertical gates, at least one gate connection region electrically connecting the two vertical gates, a first buried region located under the substrate zone having a second type of conductivity and forming a first conduction electrode of the transistor and a second region having the second type of conductivity located in the vicinity of the surface of the substrate zone and forming a second conduction electrode of the transistor.

Advantageously, the size of said portion of the bottom of the trench measured in a second direction that is perpendicular to the first direction is smaller than half of the size of the bottom of the trench measured in said second direction.

Advantageously, said two first trenches are wider than they are deep.

According to one embodiment, said at least one gate connection region comprises a second trench that is deeper than it is wide and which extends in a second direction that is perpendicular to the first direction.

As such a transistor is particularly advantageous in non-volatile memory devices, for example resistive non-volatile memory devices, the device may thus comprise memory points arranged in a matrix in rows extending in the first direction and in columns extending in a second direction that is perpendicular to the first direction in a memory plane formed in and on the semiconductor substrate, each memory point comprising a memory cell that is superposed over a MOS transistor with two vertical gates which forms a selection transistor.

Advantageously, said isolated gate regions that are located on the flanks facing the respective substrate zones of two selection transistors belonging to one and the same column and to a neighboring row are located in one and the same first trench and are at a distance from one another in the bottom of this first trench.

According to one embodiment, gate connection regions electrically connecting the two vertical gates are located on either side of a group of transistors belonging to one and the same row.

The device may comprise shallow trench isolations separating the second regions of the selection transistors of one and the same group.

The device may comprise word lines that extend in the first direction and which are electrically connected by vertical vias to said gate connection regions.

Advantageously, the memory cells are resistive memory cells.

An electronic apparatus, such as a personal computer, a mobile phone, or an on-board computer of an automobile, may advantageously comprise an integrated circuit such as defined above.

BRIEF DESCRIPTION OF THE DRAWINGS

Other advantages and features of the invention will become apparent on detailed examination of non-limiting embodiments and implementations and the appended drawings in which.

DETAILED DESCRIPTION

Three directions X, Y, Z form an orthogonal basis for the space, and are indicated in each figure.

FIGS. 1 to 4 show cross-sectional views in a plane (Y, Z) of structures obtained in various steps of an exemplary method for producing a transistor with two vertical gates.

Figure 1:
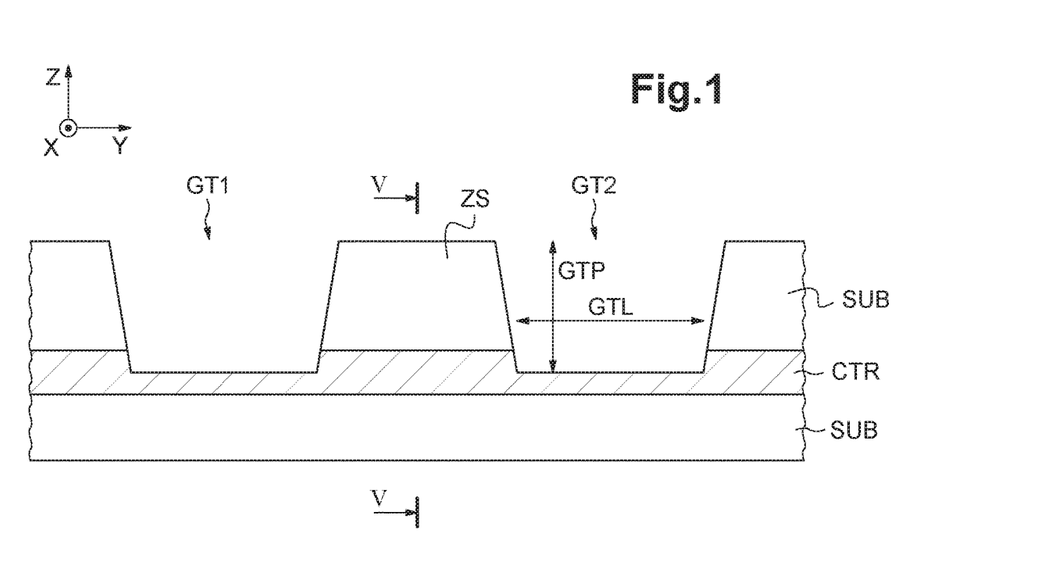
FIGS. 1 to 10 schematically show various structures obtained during the implementation of a production method according to various embodiments of an electronic circuit and an electronic apparatus.

FIG. 1 shows a semiconductor substrate SUB, doped for example of P type, in which a first buried region CTR, doped for example of N type, commonly referred to by the acronym NISO (for n-type isolation region) by those skilled in the art, has been implanted at depth, and in which two first trenches, referred to as gate trenches GT1, GT2, are etched.

The gate trenches GT1, GT2 are formed so as to be identical and extend in parallel in the direction X.

The gate trenches GT1, GT2 are etched through an upper portion of the substrate SUB and at least partially into the buried layer CTR and are wider than they are deep (GTP<GTL), GTP and GTL denoting the depth and the width of a trench, respectively.

The gate trenches GT1, GT2 together delimit a substrate zone ZS that is separated from the rest of the substrate SUB by said gate trenches and the buried layer CTR.

The substrate zone ZS will eventually accommodate an active region of a transistor.

Thus, as will become apparent below, it is particularly the depth of the buried layer CTR that parametrizes the area occupied by a transistor.

Figure 2:
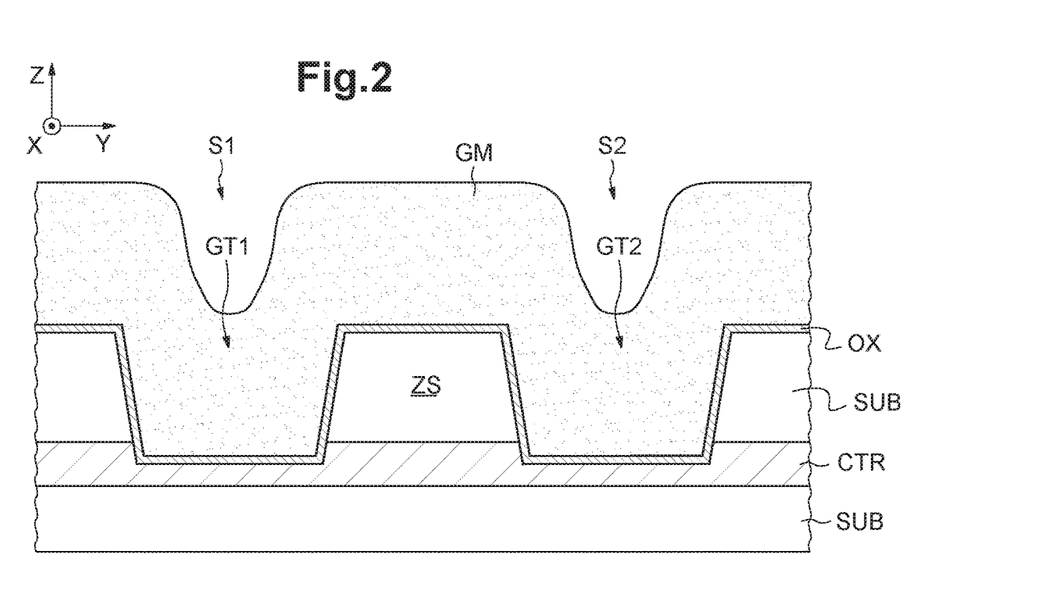

FIG. 2 shows the result of a step in which a gate material GM is deposited on the structure described in relation to FIG. 1.

In a conventional manner, a layer of gate oxide OX has been formed beforehand in said gate trenches GT1, GT2, allowing the gate material to be electrically isolated from the substrate and from the first doped region CTR.

The gate material GM may be, for example, vapor-phase-deposited polycrystalline silicon, or a metal deposited according to, for example, a Damascene process.

The deposition forms a layer of gate material GM whose thickness, taken perpendicularly to the surface on which it rests, is substantially constant. Said layer substantially hugs the form of the structure on which it has been deposited, with a tendency to blunt, or round off, the edge of said structure.

Thus, on the surface of the layer of gate material GM, this deposition results in a formation of furrows S1, S2 that are located facing the gate trenches GT1, GT2. Said furrows are substantially as deep as, but narrower than, the gate trenches.

Figure 3:
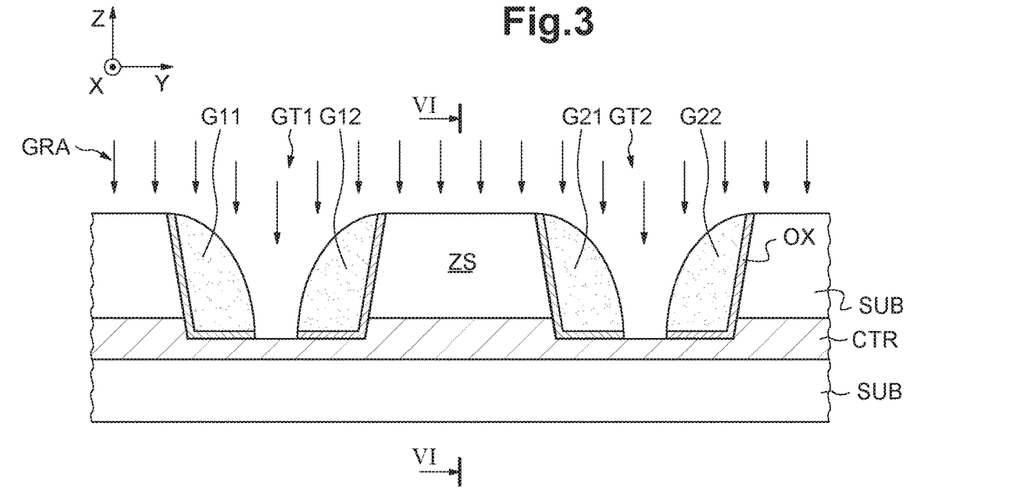

FIG. 3 shows the structure obtained after anisotropically etching GRA, in the vertical direction Z, through the layer of gate material GM and through the previously deposited layer of gate oxide OX to reach the surface of the region CTR.

Conforming to the geometries of said gate trenches GT1, GT2 and said furrows S1, S2, the operation of vertically anisotropically etching GRA the gate material GM leads to the formation of two gate regions that are positioned against the lateral walls of each trench GT1, GT2 and at a distance from one another in the bottom of the trench.

Relative to the orientation of FIG. 3, the gate region positioned against the left lateral wall of the left trench GT1 is denoted by G11, and that against the right lateral wall by G12.

Relative to the orientation of FIG. 3 and in a homologous manner, the gate regions positioned against the left and right lateral walls of the right trench GT2 are denoted by G21 and G22, respectively.

Stated otherwise, a first isolated gate region G12 is formed on the left flank of the substrate zone ZS and on a portion of the bottom of the trench GT1, and a second isolated gate region G21 is formed on the right flank of the substrate zone ZS and on a portion of the bottom of the trench GT2.

This formation may be likened to a typical formation of spacers in a dielectric material surrounding, for example, a gate region of a conventional planar MOS transistor.

Figure 4:
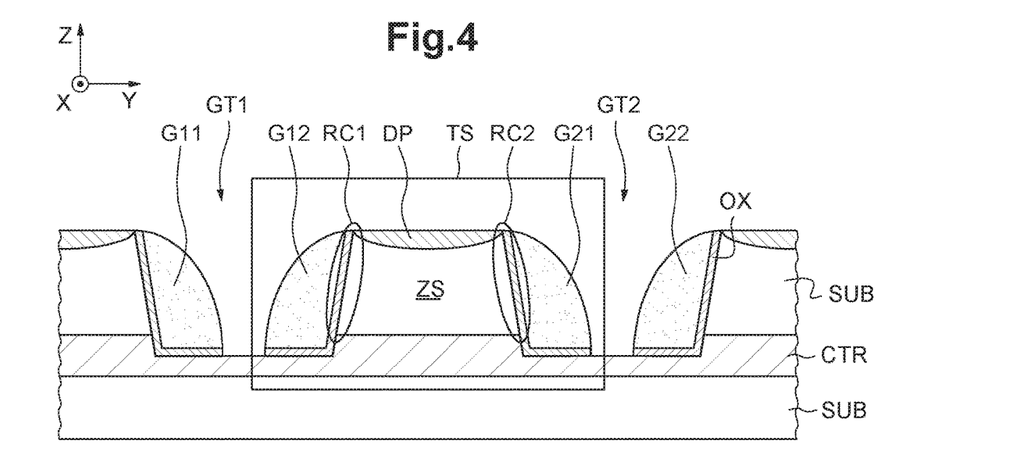

Next, as shown in FIG. 4, a second doped region DP is implanted into the surface of the substrate zone ZS.

The structure located between the two gate trenches GT1, GT2 thus obtained forms a transistor TS with two vertical gates G12, G21.

The first doped region CTR located at depth forms, in this instance, the source of the transistor TS and the second doped region DP located on the surface of zone ZS forms, in this instance, the drain of the transistor TS.

The gate regions G12 and G21, positioned on the flanks of the substrate zone ZS, form the two vertical gates of the transistor TS.

Two conduction channels, for a single transistor TS, may be formed in two respective channel regions RC1, RC2, located in the active region between the source and the drain along the flanks on which said vertical gates G12, G21 are located, respectively.

The implantation of the second doped region DP may be, for example, of N type, thus forming an NMOS transistor with two vertical gates.

It is apparent in FIG. 4 that the width, in the direction Y, of a transistor TS depends on the width of a vertical gate, namely substantially the half-width of a gate trench. In turn, the width of a gate trench GTL depends on the depth of the buried layer CTR. Thus, the depth of implantation of the layer CTR is a parameter having an influence on the area occupied by the transistor TS.

However, in particular for reasons related to the control of anisotropic etching and gate material deposition techniques, this production may occupy an area of 2F×2F, where F is the common notation for the smallest dimension achievable using a given technique.

Figure 5:
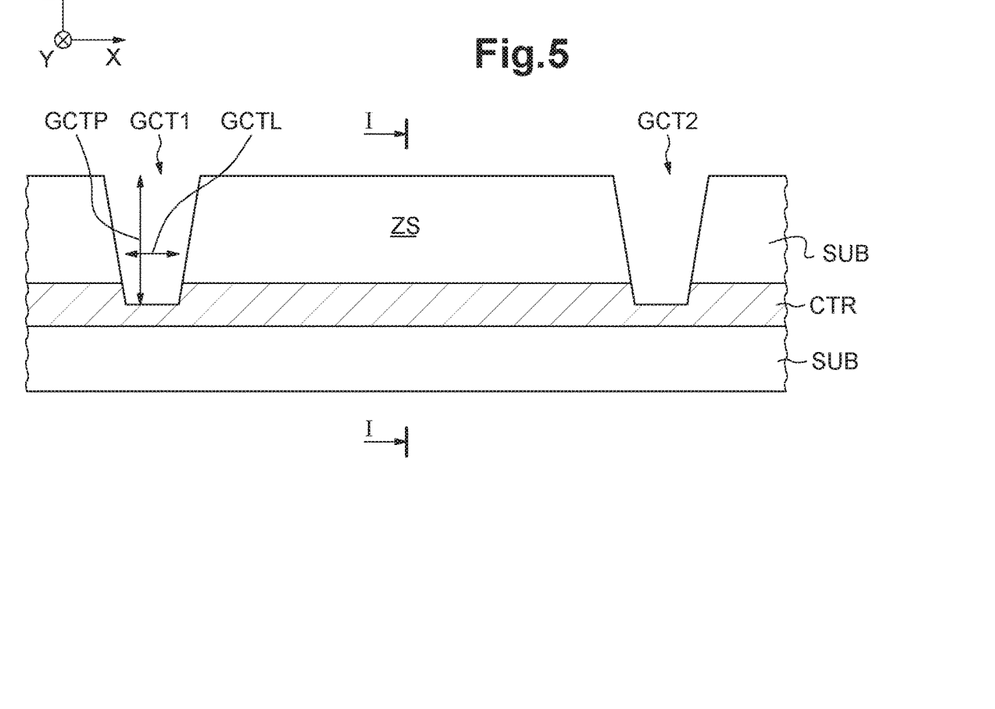
Figure 6:
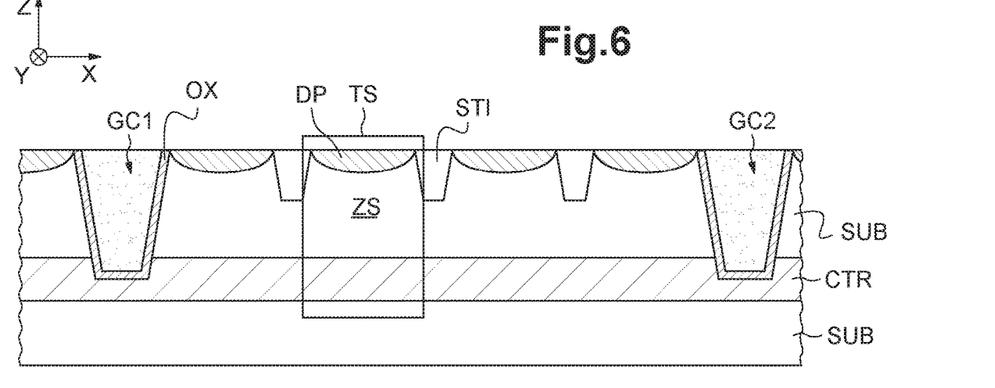

FIGS. 5 and 6 show cross-sectional views in a plane (X, Z) of the structures obtained in steps for producing transistors TS, and, more particularly, producing gate connection regions allowing, in particular, the two gates of a transistor TS to be electrically connected to one another.

FIG. 5 shows a cross-sectional view in the plane (X, Z) corresponding to the plane V-V of FIG. 1. The sectional plane of FIG. 1 corresponds to the plane I-I of FIG. 5.

In the step of etching the first gate trenches GT1, GT2, two second trenches GCT1, GCT2, referred to as gate connection trenches, are also etched in the semiconductor substrate SUB extending through the upper portion of the substrate and at least partially into the buried layer CTR.

The gate connection trenches extend parallel to the direction Y and are deeper than they are wide (GCTP>GCTL), where GCTP is the depth and GCTL the width of a gate connection trench (furthermore, GCTP=GTP).

The second trenches GCT1, GCT2 are etched, in the direction X, on either side of a zone ZS of the substrate corresponding to an active region of a transistor, or corresponding to multiple respective active regions of multiple transistors forming a group.

FIG. 6 shows a cross-sectional view in the plane (X, Z) corresponding to the plane VI-VI of FIG. 3. The sectional plane of FIG. 3 corresponds to the plane of FIG. 6.

The gate material has been deposited then etched in the manners described in relation to FIGS. 2 and 3, forming gate connection regions GC1, GC2 that fill the respective gate connection trenches GCT1, GCT2.

The gate connection regions GC1, GC2 connect the two vertical gates G12, G21 of the transistor TS to one another. In this representation, the gate connection regions GC1, GC2 connect the two vertical gates G12, G21 of the transistors belonging to one and the same group to one another, which group is formed, in this instance, by four transistors, whose gates are consequently shared.

Additionally, between each transistor of a group, shallow trench isolations STI have been formed which individually isolate, in the direction X, the portions of the second doped region DP that individually belong to one transistor of the group.

This method has been described in relation to the formation of a single group of transistors. However, this method may easily be adapted to the production of a single transistor, or of a multiplicity of transistors side-by-side and arranged individually or in groups, for example by reproducing, in the directions X and Y of the memory plane, the configuration described above for producing the selection transistors.

In particular, the unused gate regions G11 and G22 will each serve as transistor gates directly neighboring one another in the Y direction.

The transistors thus formed may advantageously be employed as selection transistors for a memory plane, for example for a resistive non-volatile memory.

Figure 7:
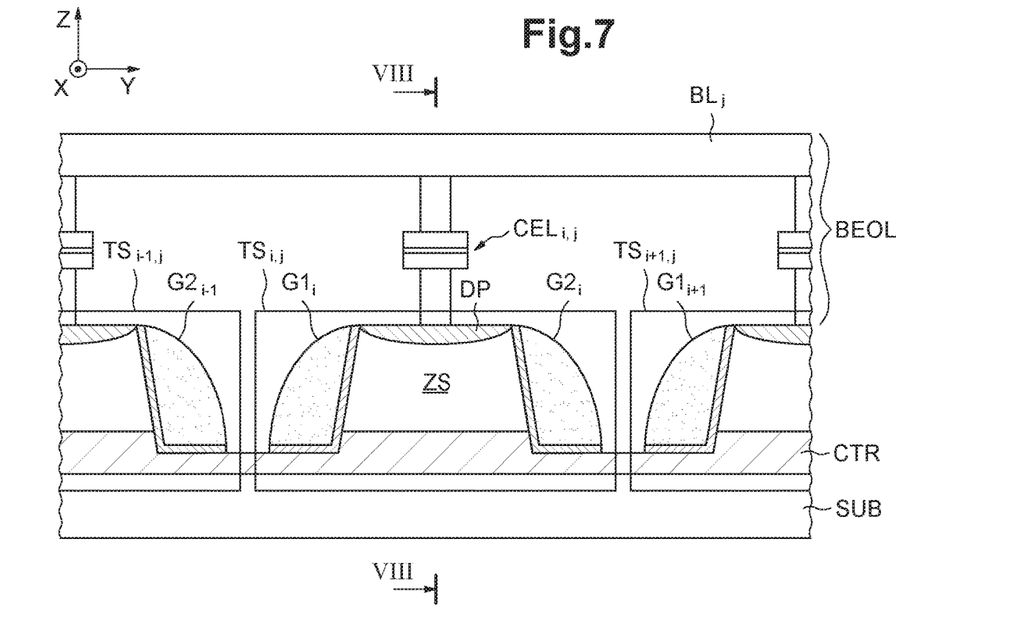
Figure 8:
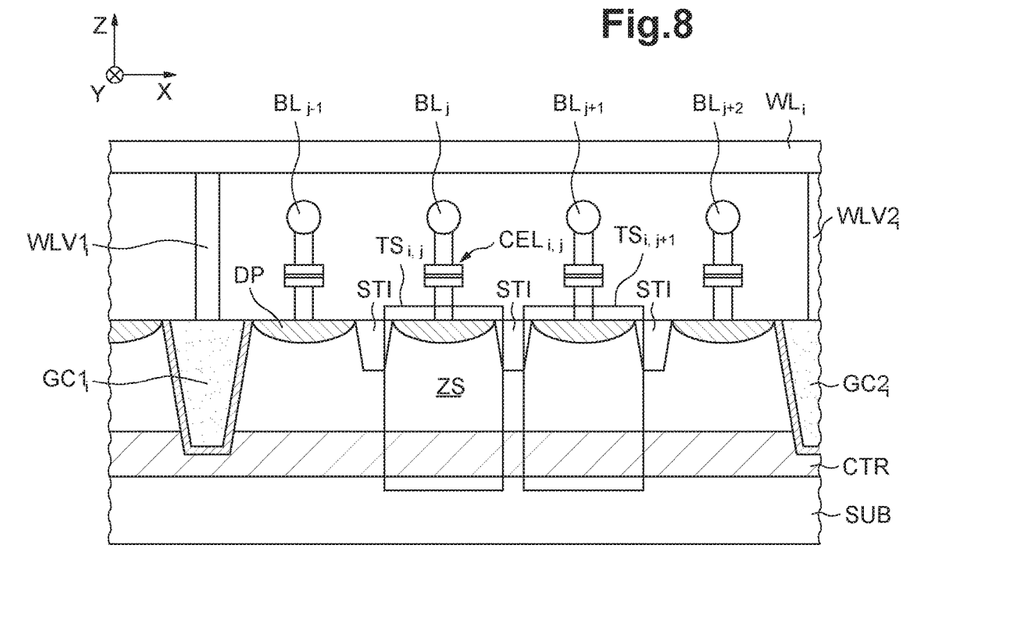
Figure 9:
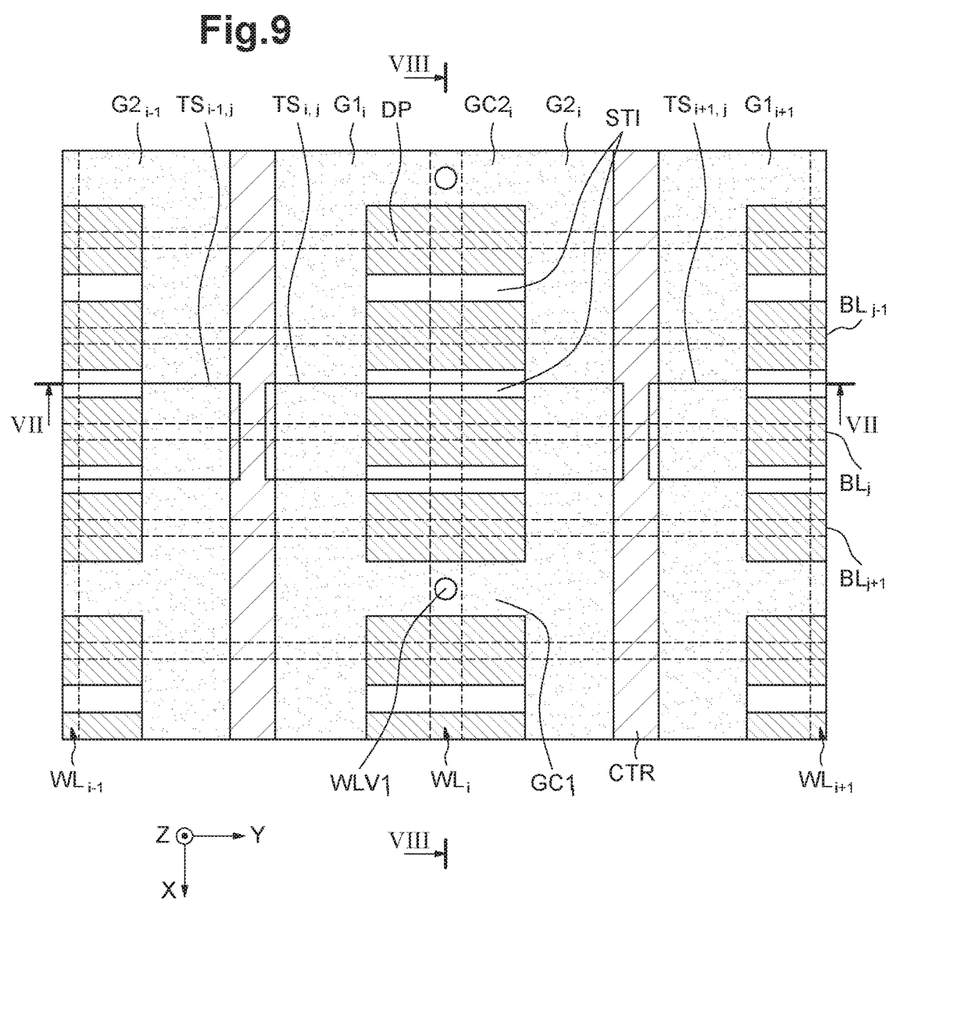

FIGS. 7 to 9 show, in various sectional planes, the structure obtained after having formed, within BEOL interconnect layers, a resistive memory cell $CEL_{i,j}$ superposed over each of the selection transistors.

The structure thus obtained forms a memory plane of a resistive memory, comprising memory points that are arranged in a matrix, in rows in the direction X and in columns in the direction Y. Each memory point comprises a selection transistor and a resistive memory cell.

A resistive memory cell usually comprises a resistive structure, comprising, for example, a phase-change material.

Voltages applied to the terminals of the resistive structure allow the resistivity of the resistive structure to be modified in a permanent and reversible manner and thus a logical datum represented by said resistivity to be stored.

However, in FIGS. 7 to 9, the elements in common with the preceding figures bear the same reference along with the row "i" to which they belong and/or the column "j" to which they belong in subscript. For the sake of clarity, the gate regions previously denoted by G11, G12, G21, G22, are in this instance denoted by $G2_{i-1}$, $G1_i$, $G2_i$, $G1_{i+1}$, respectively.

FIG. 7 shows a cross-sectional view in a plane (Y, Z) of one portion of a memory plane of a non-volatile memory device comprising selection transistors $TS_{i,j}$ produced via the method described in relation to FIGS. 1 to 6.

The memory cell $CEL_{i,j}$ is connected to the drain of the selection transistor $TS_{i,j}$ and to a metallic track, referred to as a bit line $BL_j$, along the direction Y of the columns of the memory plane through metallic vias made in the BEOL interconnect layers of the integrated circuit.

The production method described above makes it possible, in particular, for the vertical gate $G1_i$ of the transistor $TS_{i,j}$ to be electrically isolated from the vertical gate $G2_{i-1}$ of the transistor $TS_{i-1,j}$ belonging to the same column j and to an adjacent row i−1, even though said gates $G1_i$, $G2_{i-1}$ have been formed in the same trench.

Likewise, the vertical gate $G2_i$ of the transistor $TS_{i,j}$ is electrically isolated from the vertical gate $G1_{i+1}$ of the transistor $TS_{i+1,j}$ belonging to the same column j and to an adjacent row i+1, even though said gates $G2_i$, $G1_{i+1}$ have been formed in the same trench.

Thus, each vertical gate of each selection transistor is electrically isolated from the vertical gates of the selection transistor of a memory cell belonging to the same column and to a neighboring row.

Accessing a memory cell by selecting its row may be done via the gates thus formed in trenches extending in the direction X of said rows of the memory plane.

However, it is advantageous to regularly make gate connections to metallic tracks along the direction X, in particular for reasons related to controlling the conductivity of the tracks for accessing a memory cell.

FIG. 8 shows a cross-sectional view in a plane (X, Z) corresponding to the plane VIII-VIII of FIG. 7. The sectional plane of FIG. 7 corresponds to the plane VII-VII of FIG. 8.

The gate connection regions $GC1_i$, $GC2_i$ also allow contact to be made by respective vertical metallic vias $WLV1_i$, $WLV2_i$ with a word line $WL_i$ extending over the memory plane in the direction X of the rows.

Said contacts are made regularly, for example by groups of transistors.

One group of transistors comprises, for example, at least four transistors, depending on the conduction conditions preferred by the gate material GM and the implementation requirements of the device thus produced.

FIG. 9 shows a top view of the structure described in relation to FIGS. 7 and 8, their sectional planes corresponding to the planes VII-VII and VIII-VIII, respectively, of FIG. 9.

Each memory point formed by a memory cell $CEL_{i,j}$ that is superposed over a respective selection transistor $TS_{i,j}$ is connected to a bit line $BL_j$ and to a word line $WL_i$.

The bit lines $BL_j$ and the word lines $WL_i$ are formed within the BEOL interconnect layers by metallic tracks extending in the directions of the columns Y and the rows X of the memory plane, respectively, and thus allow a memory point to be selected in the matrix in order to access it.

A memory point is connected to a bit line $BL_j$ by a metallic via making contact with one terminal of the memory cell $CEL_{i,j}$, the other terminal being connected, also by a metallic via, to the drain of the selection transistor $TS_{i,j}$ of the memory point.

A memory point is connected to a word line $WL_i$ by metallic vias $WLV_i$ making contact with the gate connection regions $GC1_i$, $GC2_i$, which regions are connected to each vertical gate $G1_i$, $G2_i$ on either side of the selection transistors $TS_{i,j}$ of one and the same row i.

The selection transistors of the memory plane thus obtained may, in particular, carry twice as much current as a vertical transistor having only one gate and are not subject to the formation of parasitic conduction channels.

The vertical design of the transistors provides substantial savings in terms of the area occupied by each transistor, said area being, in particular, parametrized and adjustable by the depth of implantation of the buried layer.

Additionally, this method is compatible with the methods already in existence, and the structure obtained functions in a similar manner to existing technologies, for example in terms of accessing a memory point by means of row and column decoders.

Figure 10:
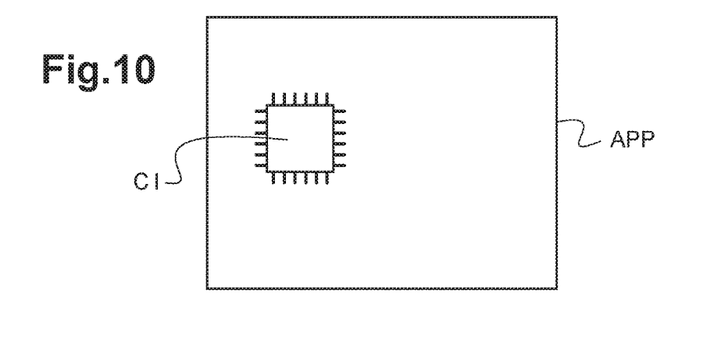

FIG. 10 shows an electronic apparatus APP, such as a personal computer, a mobile phone, or an on-board computer of an automobile, comprising an integrated circuit CI obtained through the implementation of the method described in relation to FIGS. 1 to 9, equipped, for example, with a resistive non-volatile memory.

The invention claimed is:

1. A method for producing a plurality of MOS transistors commonly controlled by two vertical gates, comprising:
   producing, in a semiconductor substrate doped with a first type of conductivity, a first buried region doped with a second type of conductivity so as to form a first conduction electrode of the plurality of MOS transistors;
   etching in a depth direction through the semiconductor substrate and at least to the first buried region to form two first parallel trenches that extend in a first direction and two second parallel trenches that extend in a second direction perpendicular to the first direction so that the first and second parallel trenches surround a substrate zone having a width and length, the width and length extending in a plane perpendicular to the depth direction, wherein the length of the substrate zone extends in the first direction and is greater than the width which extends in the second direction;
   forming, on each flank of the substrate zone along said length of the substrate zone and on a portion of the bottom of the corresponding first parallel trench, an isolated region comprising a gate material so as to form the two vertical gates;
   forming, on each flank of the substrate zone along said width of the substrate zone and on a portion of the bottom of the corresponding second parallel trench, an isolated region comprising said gate material so as to make an electrically conductive connection between the two vertical gates; and
   forming, at a top surface of the substrate zone, a plurality of second regions doped with the second type of conductivity, insulated from each other and arranged in a row along the length of the substrate zone so as to form second conduction electrodes of the plurality of MOS transistors.

2. The method according to claim 1, wherein the two first parallel trenches each have a width in the second direction that is greater than a depth in the depth direction and wherein forming the two vertical gates comprises:
   depositing a gate oxide and said gate material on the substrate zone and in said two first parallel trenches; and
   anisotropically etching the gate material and the gate oxide to expose said top surface of said substrate zone and a top surface of the first buried doped region at the bottom of the corresponding trench.

3. The method according to claim 1, wherein the two second parallel trenches each have a depth in the depth direction greater than a width in the first direction, and wherein making the electrically conductive connection comprises:
   filling the two second parallel trenches with the gate material.

4. A method for producing an integrated circuit comprising a non-volatile memory having memory points, comprising:
   producing a plurality of MOS selection transistors with two vertical gates by:
      producing, in a semiconductor substrate doped with a first type of conductivity, a first buried region doped with a second type of conductivity so as to form a first conduction electrode of the plurality of MOS selection transistors;

etching in a depth direction through the semiconductor substrate and at least to the first buried region to form two first parallel trenches that extend in a first direction and two second parallel trenches that extend in a second direction perpendicular to the first direction so that the first and second parallel trenches surround a substrate zone having a width and length, the width and length extending in a plane perpendicular to the depth direction, wherein the length of the substrate zone extends in the first direction and is greater than the width which extends in the second direction;

forming, on each flank of the substrate zone along said length of the substrate zone and on a portion of the bottom of the corresponding first parallel trench, an isolated region comprising a gate material so as to form the two vertical gates;

forming, on each flank of the substrate zone along said width of the substrate zone and on a portion of the bottom of the corresponding second parallel trench, an isolated region comprising said gate material so as to make an electrically conductive connection between the two vertical gates; and forming, at a top surface of the substrate zone, a plurality of second regions doped with the second type of conductivity, insulated from each other and arranged in a row along the length of the substrate zone so as to form second conduction electrodes of the plurality of MOS transistors; and forming a memory cell superposed over said plurality of MOS selection transistors.

5. The method according to claim 4, wherein making the electrically conductive connection comprises producing the electrically conductive connection on either side of the plurality of MOS selection transistors.

6. The method according to claim 5, further comprising forming metallic tracks extending in the first direction which are electrically connected by vertical vias to said electrically conductive connection on either side of the plurality of MOS selection transistors.

7. The method according to claim 4, wherein forming the plurality of second regions further comprises forming shallow trench isolations individually isolating, along the first direction, the second regions from each other in the row along the length of the substrate zone.

8. The method according to claim 4, wherein the memory cell is a resistive memory cell.

9. The method according to claim 4, wherein the two first parallel trenches each have a width in the second direction that is greater than a depth in the depth direction and wherein forming the two vertical gates comprises:

depositing a gate oxide and said gate material on the substrate zone and in said two first parallel trenches; and anisotropically etching the gate material and the gate oxide to expose the top surface of said substrate zone and a top surface of the first buried doped region at the bottom of the corresponding trench.

10. The method according to claim 4, wherein the two second parallel trenches each have a depth in the depth direction greater than a width in the first direction, and wherein making the electrically conductive connection comprises:

filling the two second parallel trenches with the gate material.

11. A method for producing a plurality of MOS transistors commonly controlled by two vertical gates, comprising:

etching a semiconductor substrate to form trenches which surround a rectangular semiconductor zone doped with a first type of conductivity providing a common channel region for the plurality of MOS transistors and having a buried region doped with a second type of conductivity providing a common source region for the plurality of MOS transistors, said rectangular semiconductor zone having opposed first sides and opposed second sides, wherein the opposed first sides are longer than the opposed second sides;

forming an isolated region comprising a gate material in first ones of said trenches on at least the opposed first sides of the rectangular semiconductor zone to form the two vertical gates for the plurality of MOS transistors;

making an electrically conductive connection in second ones of said trenches trench between the two vertical gates along the opposed second sides of the rectangular semiconductor zone; and forming, at a top surface of the surrounded rectangular semiconductor zone providing the common channel region, a plurality of drain regions for the plurality of MOS transistors, wherein the drain regions are insulated from each other and doped with the second type of conductivity.

12. The method of claim 11, further comprising forming a plurality of shallow trench isolations in the rectangular semiconductor zone to insulate the drain regions from each other.

13. The method of claim 11, wherein etching comprises etching two first parallel trenches that extend in a first direction to form the first ones of the trenches and define the opposed first sides of the rectangular semiconductor zone.

14. The method of claim 13, wherein forming the isolated region comprises forming a gate insulator layer on the opposed first sides of the rectangular semiconductor zone and forming a gate electrode on the gate insulator layer.

15. The method of claim 14, wherein etching further comprises etching two second parallel trenches that extend in a second direction to form the second ones of the trenches and define the opposed second sides of the rectangular semiconductor zone, wherein the second direction is perpendicular to the first direction.

16. The method of claim 15, wherein forming the gate electrode comprises:

depositing a gate electrode material in both the two first parallel trenches and the two second parallel trenches; and anisotropically etching the gate electrode material and the gate insulator layer at the two first parallel trenches to form the two vertical gates.

* * * * *